US012151916B2

(12) United States Patent
Bütler et al.

(10) Patent No.: US 12,151,916 B2
(45) Date of Patent: Nov. 26, 2024

(54) METHOD FOR AT LEAST PARTIALLY AUTOMATED PLANNING OF AN INSTALLATION OF ELEVATOR COMPONENTS OF AN ELEVATOR SYSTEM

(71) Applicant: Inventio AG, Hergiswil (CH)

(72) Inventors: Erich Bütler, Ebikon (CH); Philipp Zimmerli, Harkingen (CH); Raphael Bitzi, Lucerne (CH)

(73) Assignee: INVENTIO AG, Hergiswil (CH)

( * ) Notice: Subject to any disclaimer, the term of this patent is extended or adjusted under 35 U.S.C. 154(b) by 696 days.

(21) Appl. No.: 17/309,212

(22) PCT Filed: Dec. 2, 2019

(86) PCT No.: PCT/EP2019/083250
§ 371 (c)(1),
(2) Date: May 7, 2021

(87) PCT Pub. No.: WO2020/120190
PCT Pub. Date: Jun. 18, 2020

(65) Prior Publication Data
US 2021/0395046 A1    Dec. 23, 2021

(30) Foreign Application Priority Data

Dec. 13, 2018    (EP) .................................. 18212328

(51) Int. Cl.
*B66B 19/00*    (2006.01)
*B66B 7/02*    (2006.01)
*G06F 30/20*    (2020.01)

(52) U.S. Cl.
CPC ............ *B66B 19/002* (2013.01); *G06F 30/20* (2020.01); *B66B 7/023* (2013.01)

(58) Field of Classification Search
CPC ........ B66B 19/002; B66B 7/023; G06F 30/20
(Continued)

(56) References Cited

U.S. PATENT DOCUMENTS 4,345,671 A * 8/1982 Tosato .................. B66B 19/002
                                                      52/30
5,065,843 A * 11/1991 Richards ............... B66B 19/002
                                                      187/408
(Continued)

FOREIGN PATENT DOCUMENTS

CN    202729520 U    2/2013
CN    103373653 A    10/2013
(Continued)

OTHER PUBLICATIONS

Lutfi Al-Sharif ( Planning Elevator Installations in Buildings, Lift Report 2017; 43(2): 18-28) (Year: 2017).*

*Primary Examiner* — Iftekhar A Khan
(74) *Attorney, Agent, or Firm* — Williams J. Clemens; Shumaker, Loop & Kendrick, LLP (57) ABSTRACT

An at least partially automated method for planning installation of elevator components in an elevator shaft delimited by shaft walls includes the steps: recording the course of the shaft walls; determining positions of door openings in the shaft; establishing a target course of a guide rail depending on the positions of the openings; and establishing target positions of the elevator components automatedly depending on the established guide rail target course. Adjustable ones of the elevator components have a part fixable to the shaft wall and a part movable in an adjustment range relative to the fixable part. Target positions of the movable parts are established for the adjustable components. An automated check is carried out to determine whether, when the movable part is positioned at the target position, the adjustment range is sufficient to fix the fixable part to the shaft wall and the results are output for further processing.

16 Claims, 6 Drawing Sheets

(58) Field of Classification Search
USPC .......................................................... 703/7
See application file for complete search history.

(56) References Cited

U.S. PATENT DOCUMENTS

| | | | | |
|---|---|---|---|---|
| 7,444,732 B2* | 11/2008 | Cruz | ..................... | B66B 19/002 187/408 |
| 8,684,143 B2* | 4/2014 | Rossignol | ................. | B66B 9/00 187/409 |
| 9,890,019 B2* | 2/2018 | Kere | ........................ | E04G 3/28 |
| 10,209,066 B2* | 2/2019 | Kilpeläinen | .......... | B66B 19/002 |
| 10,689,228 B2* | 6/2020 | Roberts | ................ | B66B 5/0037 |
| 11,111,109 B2* | 9/2021 | Cambruzzi | ............. | B66B 19/00 |
| 11,365,095 B2* | 6/2022 | Haag | ..................... | B66B 19/002 |
| 11,396,440 B2* | 7/2022 | Studer | ................... | B66B 5/0037 |
| 11,530,114 B2* | 12/2022 | Haag | ........................ | B66B 7/024 |
| 2002/0079169 A1* | 6/2002 | Moncini | ..................... | B66B 7/06 187/266 |
| 2004/0154174 A1* | 8/2004 | Pfenniger | .............. | G01B 11/16 33/286 |
| 2010/0133046 A1* | 6/2010 | Allwardt | ................. | B66B 7/123 187/251 |
| 2010/0133048 A1* | 6/2010 | Barneman | ............... | B66B 19/00 187/414 |
| 2013/0118838 A1* | 5/2013 | Plathin | .................... | B23P 17/00 29/401.1 |
| 2014/0048357 A1* | 2/2014 | Kalliomaki | ............... | B66B 5/22 187/373 |
| 2014/0332323 A1* | 11/2014 | Christen | ............. | E05D 15/1005 187/330 |
| 2015/0107186 A1* | 4/2015 | Wilts | .................... | B66B 19/002 52/741.1 |
| 2015/0217972 A1* | 8/2015 | Hawkins | ................ | G01C 15/10 187/408 |
| 2015/0314993 A1* | 11/2015 | Bolme | .................... | B66B 19/00 52/741.1 |
| 2016/0060078 A1* | 3/2016 | Mertala | ................. | B66B 19/002 52/741.1 |
| 2016/0311659 A1* | 10/2016 | Mertala | ................... | E04G 3/246 |
| 2016/0332852 A1* | 11/2016 | Mertala | ................... | B66B 19/00 |
| 2017/0015523 A1* | 1/2017 | Baker | .................... | F16M 13/02 |
| 2018/0079624 A1* | 3/2018 | Kirsch | ............... | B66B 11/0407 |
| 2018/0208438 A1* | 7/2018 | Cambruzzi | ............. | B66B 19/00 |
| 2018/0208439 A1* | 7/2018 | Studer | ..................... | B66B 19/00 |
| 2019/0248624 A1* | 8/2019 | Romo | .................. | B66B 19/002 |
| 2019/0276277 A1* | 9/2019 | Christen | ................. | B66B 19/00 |
| 2020/0283263 A1* | 9/2020 | Studer | ................... | B66B 5/0087 |
| 2020/0299105 A1* | 9/2020 | Cambruzzi | ............. | B66B 19/00 |
| 2020/0377339 A1* | 12/2020 | Cambruzzi | ......... | G01C 15/004 |
| 2021/0139286 A1* | 5/2021 | Cambruzzi | ........... | B66B 19/002 |
| 2021/0156666 A1* | 5/2021 | Cambruzzi | ............. | B66B 19/00 |
| 2022/0024722 A1* | 1/2022 | Hosemann | .............. | B66B 7/024 |
| 2023/0103326 A1* | 4/2023 | Cambruzzi | ............. | B66B 7/024 52/30 |

FOREIGN PATENT DOCUMENTS

| | | |
|---|---|---|
| CN | 103803376 A | 5/2014 |
| CN | 205187554 U | 4/2016 |
| CN | 107848768 A | 3/2018 |
| CN | 207275948 U | 4/2018 |
| CN | 208054675 U | 11/2018 |
| EP | 3085658 A1 * | 10/2016 |
| EP | 3085658 B1 | 8/2017 |
| JP | H0624667 A | 2/1994 |
| JP | 2003335477 A | 11/2003 |
| JP | 2004043135 A | 2/2004 |
| JP | 2018054346 A | 4/2018 |
| JP | 2019509955 A | 4/2019 |
| WO | 2017016783 A1 | 2/2017 |
| WO | 2018041815 A1 | 3/2018 |

* cited by examiner

Fig. 9

METHOD FOR AT LEAST PARTIALLY AUTOMATED PLANNING OF AN INSTALLATION OF ELEVATOR COMPONENTS OF AN ELEVATOR SYSTEM

FIELD

The invention relates to a method for at least partially automated planning of an installation of elevator components of an elevator system.

BACKGROUND

EP 3085658 B1 describes a method for partially automated planning and implementation of an installation of elevator components of an elevator system in an elevator shaft delimited by shaft walls. In this method, door openings in the elevator shaft are marked using reflectors. Then, the shaft walls and the positions of the reflectors and thus the door openings are recorded by means of an automated scanning device, in the form of a total station, arranged in the elevator shaft. Based on the positions of the door openings and the dimensions of an elevator car of the elevator system, target courses of at least two guide rails composed of individual guide rail pieces for guiding the elevator car within the elevator shaft are then determined. The lowest guide rail piece of each guide rail is fixed manually to a shaft wall by a technician. An automated installation device is then brought into the elevator shaft, which automatically fixes the remaining guide rail pieces of the two guide rails to the shaft walls. EP 3085658 B1 does not contain any information on selecting or testing the fixings of the guide rails to the shaft walls.

SUMMARY

In contrast, the problem addressed by the invention is, in particular, that of providing a method for at least partially automated planning of an installation of elevator components of an elevator system, which method makes it possible for the subsequent installation to be carried out successfully and efficiently.

The method according to the invention for at least partially automated planning of an installation of elevator components of an elevator system in an elevator shaft delimited by shaft walls has the following steps:
  recording the course of the shaft walls;
  determining positions of door openings in the elevator shaft;
  establishing a target course of a guide rail depending on the specific positions of the door openings; and
  establishing target positions of the elevator components in an automated manner depending on the established course of the guide rail.

At least some of the elevator components to be installed are designed as adjustable elevator components which have a part that can be fixed to a shaft wall and a part that is movable in an established adjustment range with respect to the fixable part, target positions of the movable parts being established for adjustable elevator components. According to the invention, for an adjustable elevator component, in particular for all adjustable elevator components, an automated check is carried out to determine whether, when the movable part of the elevator component is positioned at its target position, the aforementioned adjustment range is sufficient to fix the fixable part to the shaft wall. The results of the aforementioned test are output for further processing.

By taking into account the aforementioned results of the test and initiating measures if the test shows that the adjustment range of one or more adjustable elevator components is not sufficient, it can be ensured that the adjustable elevator components can be fixed to the shaft walls at their target positions and thus the guide rail can also be arranged at its target position. Without such a test, there would be a very high risk that adjustable elevator components cannot be installed as planned during the planned installation. This would entail time-consuming reworking or the procurement of other, suitable elevator components. The planning of the installation according to the invention makes it possible for the elevator components to be installed as planned with a high degree of probability, so that time-consuming and thus cost-intensive reworking or interruptions during installation are avoided. The installation thus leads to the target result very efficiently.

The described steps of the method are carried out in particular in the specified order. However, a different order is also possible.

"At least partially automated planning" is to be understood here as meaning that at least individual steps of the planning are carried out in an automated manner, for example by a computer or a control means using predetermined rules. For this purpose, the computer or the control means has a program in which the aforementioned rules are coded. An operator is also involved in the planning, although their involvement can only consist of starting completely automated planning. In addition, there is also the possibility of an operator making decisions at different points, supported by information made available automatically.

The elevator components, the installation of which is planned, are designed in particular as so-called shaft material of the elevator system or as shaft doors. Shaft material refers to all components that are fastened to a shaft wall in an elevator shaft of the elevator system. These include, for example, so-called rail brackets, by means of which guide rails of the elevator system are fixed to the shaft wall. In addition, shaft material can also be designed as fastening material for shaft doors, lighting or cabling. Shaft doors are mounted in door openings in the elevator shaft and close the door openings if no elevator car is arranged at a door opening.

"Planning of the installation of elevator components" is understood here to mean, in particular, establishing the position and, if applicable, alignment or orientation of the individual elevator components of the fully installed elevator system. In addition, an at least partial installation can also be planned using an automated mounting device. For example, an installation sequence of the elevator components, a position of the mounting device while the installation steps are carried out and/or the use of special tools can be established. The aforementioned automated mounting device can be designed, for example, in accordance with a mounting device described in WO 2017/016783 A1.

The shaft walls delimiting the elevator shaft are designed in particular as solid walls, for example made of concrete. However, it is also possible that an elevator shaft is delimited in at least one or two directions not by a solid wall, but by struts, preferably made of metal. Such struts are also referred to as divider beams. A shaft wall delimiting the elevator shaft can thus also be formed by struts, in particular divider beams.

When the courses of the shaft walls are recorded, in particular positions of a large number of individual points on the shaft walls are recorded. These wall points then form a so-called point cloud, from which the courses of the shaft walls are determined. The aforementioned positions can be recorded, for example, by means of a measuring system based on one or more laser scanners or on one or more digital cameras. For this purpose, the measuring system is displaced in particular within the elevator shaft so that the courses of all shaft walls can be completely recorded. A digital model of the elevator shaft can thus be generated. The measuring system can be designed, for example, like a measuring system described in WO 2018/041815 A1.

When recording the courses of the shaft walls, individual or a plurality of reference elements can also be arranged in the elevator shaft. In this way, for example, a coordinate system can be established in the elevator shaft, which can also be used for installing the elevator elements later. The reference elements can be designed, for example, in the form of cords tensioned in the elevator shaft and/or as spheres and/or other markings.

The positions of the door cut-outs can be recorded manually by an operator, in a partially automated manner or in a completely automated manner. The aforementioned positions are recorded in particular on the basis of the recorded courses of the shaft walls. For example, the courses of the shaft walls can be displayed to an operator on a screen. On this basis, the operator automatically determines the positions of the door cut-outs and establishes them, for example, with a mouse click. It is also possible, analogously to the procedure in the aforementioned EP 3085658 B1, for the door openings to be marked in such a way that the markings can, in particular, be recognized automatically before the profiles of the shaft walls are recorded. In addition, it is possible to record the positions of the door openings in a fully automated manner on the basis of the recorded courses of the shaft walls. The result of this automated recording can optionally be checked and adjusted by an operator.

A guide rail is used to guide the elevator car and optionally a counterweight of the elevator system while it is being displaced in the elevator shaft. In the following, only guide rails for the elevator car are considered. The same applies to the counterweight guide rails. An elevator system usually has two guide rails for the elevator car. The positions of the guide rails establish the position and the travel path of the elevator car in the elevator shaft. The guide rails must therefore be positioned in such a way that the elevator car can be stopped at the door openings in the elevator shaft in such a way that it is possible to enter and leave the elevator car at all door openings and, in particular, the shaft doors arranged at the door openings can be opened and closed together with a car door. In addition, the guide rails must extend in such a way that the elevator car can be displaced in the elevator shaft without colliding with the shaft walls.

To establish the position of the guide rails, a straight line is laid through corners of the door openings, in particular on both sides of the door openings. For example, the least squares method can be used for this purpose. The two straight lines are determined so that they are parallel to one another. As an additional condition, particularly in the case of elevators with a low height, for example up to 50 m, it can be specified that the straight lines extend in the vertical direction. Depending on the dimensions of the elevator car, target profiles of the guide rails are obtained.

The target course of the guide rails results in target positions of elevator components to be fixed to shaft walls, for example of rail brackets for fastening the guide rails to a shaft wall or of shaft doors, which must be aligned in a predetermined manner with respect to the elevator car and thus with respect to the guide rails. To determine the target positions of rail brackets, a predetermined distance in the vertical direction between two rail brackets arranged one above the other can be taken into account as a further condition.

At least some of the elevator components are designed as adjustable elevator components which have a part that can be fixed to a shaft wall and a part that is movable in an established adjustment range with respect to the fixable part. The moving part is only movable and thus adjustable with respect to the fixable part during the installation of the elevator component. When the elevator system has been mounted, the two parts of an adjustable elevator component are firmly connected to one another in a certain position, for example by means of a screw connection. The term "adjustable elevator component" therefore only refers to the duration of the installation. After completion of the installation, the part designated as movable is also fixed in an established position in relation to the shaft wall.

The adjustable elevator components are designed in particular as rail brackets for fastening the guide rail to a shaft wall. Rail brackets are also known as brackets and are available in many variants on the market. The rail brackets each have a rail bracket lower part as a fixable part and a rail bracket upper part as a movable part. When the elevator system has been mounted, a guide rail is connected to the rail bracket upper part by means of a suitable clip and is thus fixed, in particular screwed, to a shaft wall by means of the rail bracket upper part and the rail bracket lower part. The terms "rail bracket lower part" and "rail bracket upper part" only serve to differentiate the two parts and do not say anything about a necessary orientation or arrangement of the parts to one another.

Owing to the connections between the guide rail and the moving parts of the elevator component, the positions of the moving parts of the elevator components are established by the target course of the guide rail. An automated check is carried out for at least one, in particular for each adjustable elevator component, to determine whether, when the movable part of the elevator component is positioned at its target position, the aforementioned adjustment range is sufficient to fix the fixable part to the shaft wall. In other words, a check is carried out to determine whether the two parts of the elevator component can be arranged in relation to one another in such a way that the movable part is arranged at its target position and the fixable part can be fixed to a shaft wall. If this is the case, the corresponding elevator component can be installed as desired. In the example of a rail bracket comprising a fixable rail bracket lower part and a movable rail bracket upper part, the rail bracket upper part can be positioned in such a way that the guide rail has its target course, the rail bracket lower part is fixed to a shaft wall and the rail bracket upper part is also fixed to the rail bracket lower part.

The aforementioned test provides a positive result if the adjustable elevator component can be installed as intended, i.e., if the adjustment range of the elevator component is sufficient. It provides a negative result if this is not possible, i.e., the adjustment range is insufficient.

The results can be output in a wide variety of ways. The results can, for example, be output on a screen, for example in the form of a table, and further processed by an operator. It is also possible for the aforementioned output to take place by being passed on in electronic form to a special program module which processes the results further.

In an embodiment of the invention, the elevator components are supported on support surfaces on the shaft wall. A surface contour of target support surfaces is derived from the recorded courses of the shaft walls and the target positions of the elevator components, the surface contour of the target support surfaces is automatically checked and the results of the test of the target support surfaces are output for further processing. This makes it particularly probable that the elevator components can actually be installed at their target positions.

Shaft walls, especially if they are made of concrete, can have irregularities in the form of elevations, for example shoulders or depressions, for example holes, on their surface and thus in their surface structure. Such irregularities can make it difficult or even impossible to fix elevator components on a shaft wall. The irregularities can have a negative influence on the support of the elevator component on the shaft wall and prevent holes from being drilled into which screws or anchor bolts are then inserted to fix the elevator elements. By checking the surface contour of the intended support surface of an elevator component, it can be ensured that the elevator component can also be fixed to the shaft wall as planned, i.e., in particular, can be screwed on.

The aforementioned test is carried out in particular for all elevator components to be installed, i.e., for adjustable and non-adjustable elevator components. The test delivers a positive result if the surface contour of the target support surface does not conflict with installation of the elevator component. It gives a negative result if the surface contour conflicts with the aforementioned installation.

In order to check the surface contour, first irregularities in the surface contour of a target support surface are recognized in particular by means of a first recognition rule. As a result of the test of the target support surfaces, it is output whether a target support surface is free of first irregularities. The test thus provides a positive result if the target support surface does not have any first irregularities and a negative result if it has first irregularities.

In particular, when determining the surface contour of the target support surfaces using the determined positions of the aforementioned wall points, an ideal wall surface is determined. The ideal wall surface can be determined, for example, in such a way that the sum of the squares of the distances between the wall points and the ideal wall surface is minimal, i.e., the least squares method is used. It is also possible to use the RANSAC algorithm (random sample consensus) to determine the ideal wall surface. After determining the ideal wall surface, the distances between the individual wall points and the ideal wall surface are determined. These distances serve as the basis for recognizing irregularities in the surface contour of the target support surfaces.

After the surface contour of the target support surface has been determined, this is checked and first irregularities in the surface contour are recognized by means of a first recognition rule. For example, a first irregularity at a wall point can be recognized if the distance between the point on the wall and the ideal wall surface is greater than a first threshold value.

The surface contour can in particular be checked in several stages, in particular in two stages. This can be implemented in such a way that, if a target support surface does not have a first irregularity, second irregularities in the surface contour of the target support surface are recognized by means of a second recognition rule and, as a result of the test of the target support surfaces, it is output whether a target support surface is free of second irregularities. During the first test, a rough and therefore quick check can be carried out in particular. Only if this rough check provides a positive result can irregularities be checked for more precisely in the second check. This means that the entire test can be carried out very quickly and still thoroughly. It is thus possible, for example, for only comparatively large irregularities to be recognized by means of the first recognition rule and for small irregularities to also be recognized only by means of the second recognition rule. The first and second irregularities can in particular be determined and stored in preparation for the aforementioned test for the entire elevator shaft.

In particular, the first recognition rule for recognizing first irregularities in the surface contour comprises the following steps:
  determining wall points which are at a distance from the ideal wall surface that is greater than a first threshold value;
  combining neighboring wall points which meet the aforementioned condition; and
  recognizing a first irregularity when an area of the combined wall points is greater than a boundary area.

The first threshold value is, for example, between 5 and 10 mm and the boundary surface area is, for example, between 15 and 30 cm$^2$. When the wall points are combined, for example, the wall points are combined which meet the aforementioned condition and are also at a distance from another wall point which meets the aforementioned condition and which is less than a limit distance of, for example, 5 to 50 mm. In addition, a rectangle can be defined when combining, which rectangle contains all of the aforementioned wall points.

In particular, the second recognition rule for recognizing second irregularities in the surface contour comprises the following steps:
  determining wall points which are at a distance from the ideal wall surface that is greater than a second threshold value; and
  recognizing a second irregularity at each wall point which meets the aforementioned condition.

The second threshold value can be the same as the aforementioned first threshold value or differ therefrom. The second threshold value can in particular be smaller than the first threshold value and, for example, be between 3 and 5 mm.

In an embodiment of the invention, if a negative result is output for an elevator component, the original target position is automatically shifted to a new target position of the elevator component and the new target position is checked. In the event of a negative result for an elevator component, i.e., if an elevator component cannot be installed as planned, an operator does not need to directly intervene. The method can thus be automated to a very large extent.

The new target position deviates from the original target position, in particular by an established distance of, for example, 5-10 cm. The shift takes place in particular along the target course of the guide rail. Since the target position of the movable part is established in the case of adjustable elevator components, the target position of the movable part is also shifted when the target position of the elevator components is shifted. This also changes the possible target support surfaces of the associated fixable parts of the adjustable elevator components.

The aforementioned shift of the target position is carried out in particular only within an established shift range. A negative result is output if no suitable target position can be found within the shift range. The aforementioned negative result can be referred to as a final negative result, since a further shift of the target position is no longer possible. This result can be specially marked and thus also specially processed.

The aforementioned shift range extends, for example, 20-30 cm from the original target position in both directions along the target course of the guide rail.

In an embodiment of the invention, if a negative result is output for an elevator component, the target course of the guide rail is automatically changed. This is carried out in particular if the test for an elevator component has delivered a final negative result as described above. It is therefore necessary for an operator to intervene in particularly few cases. The method can thus be automated to a particularly large extent.

After changing the target course of the guide rail, the described tests of the elevator components are carried out again. The target course can be shifted, for example, by an established distance, for example 1-3 cm parallel to the door openings.

In an embodiment of the invention, if a negative result of the test of the adjustment range for an elevator component is output, a necessary adjustment range of this elevator component is automatically determined and output. The problem of the adjustment range not being sufficient is thus not solved by shifting the target position, but rather by using an elevator component with a sufficient or suitable adjustment range. This also ensures that the installation can also be carried out. By determining and outputting the necessary adjustment range, a suitable elevator component can be found particularly easily or, if necessary, specially manufactured. A suitable elevator component does not necessarily have to have a larger adjustment range; it can even be smaller than in the case of the originally planned elevator component. The adaptation can take place in particular by adapting the fixable part or the movable part of the elevator component. For example, a rail bracket part can be designed in such a way that the associated rail bracket upper part is at a greater distance from the shaft wall.

The necessary adjustment range can be determined by virtually arranging the adjustable part of the elevator component at its target position and the fixable part on a shaft wall. The necessary adjustment range must then be at least such that the two parts of the elevator component can be connected, for example screwed, to one another.

In an embodiment of the invention, the positions of the door openings in the elevator shaft are automatically determined from the recorded courses of the shaft walls. The method can thus be automated to a very large extent. Recesses of a sufficient size and characteristic shape for a door opening can be identified automatically in the course of the shaft walls. Then, corners of the recesses can be determined.

The positions of the door openings can be automatically determined particularly effectively if first rough positions and then the positions of the door openings are determined in a region around the rough positions. In particular, the rough positions can be determined on the basis of 2D data and the exact positions of the door openings in the vicinity of the rough positions can be determined on the basis of 3D data.

The automatically determined positions of the door openings can in particular be changed by an operator. The method is thus very flexible despite a high degree of automation.

The positions of the door openings can also be automatically determined independently of the described test of the adjustment ranges of adjustable elevator components. Thus, a method for at least partially automated planning of an installation of elevator components in an elevator shaft delimited by shaft walls, comprising the following method steps:

recording the course of the shaft walls;
determining positions of door openings in the elevator shaft in an automated manner;
establishing a target course of a guide rail depending on the specific positions of the door openings; and
establishing target positions of elevator components in an automated manner depending on the established course of the guide rail, constitutes an independent invention.

In an embodiment of the invention, the planned installation is carried out at least partially by an automated mounting device. During the planning, an additional check is then carried out to determine whether the mounting device can install the elevator components at their respective target positions on the shaft walls. By carrying out the installation in an at least partially automated manner, not only the planning but also the installation can be carried out very effectively. In addition, the aforementioned additional test ensures that the installation can also be carried out safely by the mounting device.

The mounting device in particular comprises a carrier component and a mechatronic installation component. The carrier component is designed to be displaced relative to the elevator shaft, i.e., within the elevator shaft, for example, and to be positioned at different heights within the elevator shaft. The installation component is held on the carrier component and is designed to carry out an installation step as part of the installation process in an at least partially automated, preferably fully automated, manner. The installation component is designed as an industrial robot, for example. The mounting device has, in particular, a displacement device by means of which the carrier component can be moved in the elevator shaft, and a fixing component for fixing, in particular securing, the carrier component in the elevator shaft. The mounting device has, in particular, a control means for controlling the individual components of the mounting device. The mounting device is designed, for example, in accordance with a mounting device described in WO 2017/016783 A1.

To check whether the mounting device can install the elevator components at their respective target positions on the shaft walls, a simulation of the mounting of the individual elevator components is carried out, for example. A computer-aided simulation tool is used in the aforementioned simulation, in which tool the mounting device and the elevator shaft are modeled. A simulation of the individual automated mounting steps is then carried out. During the simulation, a check can be carried out, by an operator or in an automated manner, to determine whether the mounting steps can actually be carried out or whether there are, for example, collisions between the installation component and the elevator shaft or the carrier component.

Further advantages, features and details of the invention will become apparent from the following description of embodiments and from the drawings, in which identical or functionally identical elements are denoted with identical reference signs. The drawings are merely schematic and not to scale.

DETAILED DESCRIPTION

Figure 1:
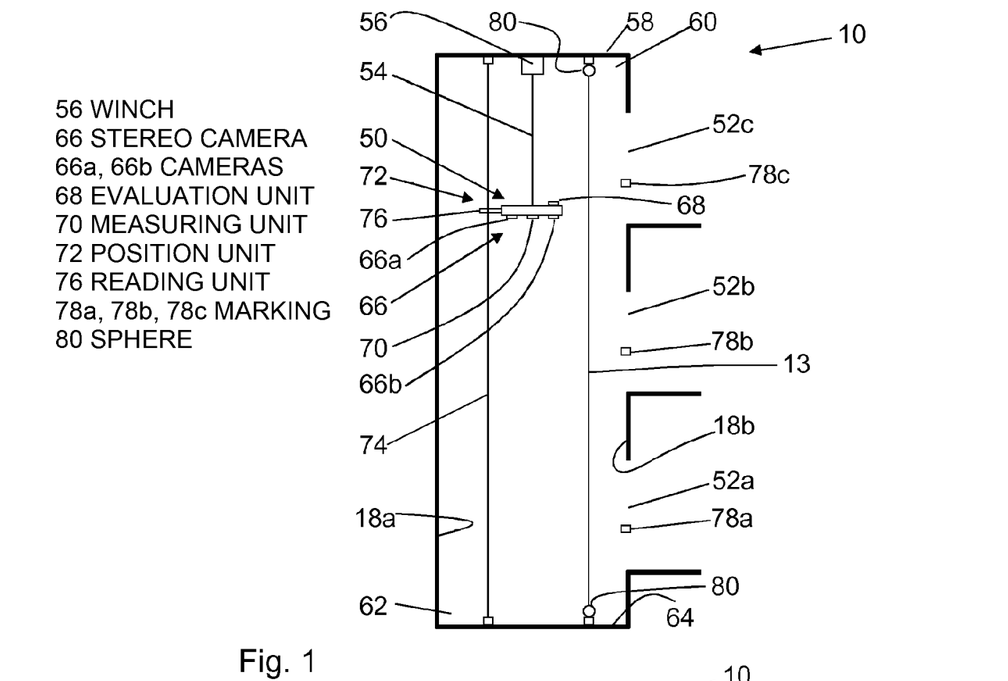
FIG. 1 shows a measuring system for recording the course of shaft walls in an elevator shaft of an elevator system.

In a method for at least partially automated planning of an installation of elevator components in an elevator shaft delimited by shaft walls, the elevator shaft is measured in a first method step, in which the courses of the shaft walls are recorded. FIG. 1 shows a measuring system 50 arranged in an elevator shaft 10. The vertically aligned elevator shaft 10 is delimited by four shaft walls made of concrete, although FIG. 1 only shows a rear shaft wall 18a and a front shaft wall 18b. The front shaft wall 18b has a total of three door openings 52a, 52b, 52c arranged one above the other. When the elevator system has been fully mounted, shaft doors are arranged in the door openings 52a, 52b, 52c, which shaft doors close the elevator shaft 10 and only allow access to an elevator car (not shown in FIG. 1) if the elevator car is positioned at the corresponding shaft door.

In this case, the measuring system 50 is designed, for example, as an optical-inertial measuring system that is suspended from a shaft ceiling 58 of a shaft head 60 of the substantially cuboid elevator shaft 10 by means of a cable 54 and a winch 56. Opposite the shaft head 60, the elevator shaft 10 has a shaft pit 62 which is closed off by a shaft bottom 64.

The measuring system 50 has a camera system comprising a plurality of, in particular four or five, digital stereo cameras. The stereo cameras are arranged in such a way that all of the shaft walls can be recorded. A digital stereo camera 66 comprising a first camera 66a and a second camera 66b is discussed below by way of example. The stereo camera 66 is designed such that, in the state shown, it can capture details of all four shaft walls. The stereo camera 66 is connected by signals to an evaluation unit 68 of the measuring system 50, which receives and evaluates the images captured by the stereo camera 66. The evaluation unit 68 searches the images for distinctive points, for example corners or elevations in one of the shaft walls. As soon as it has identified a distinctive point in both images of the cameras 66a, 66b, it can use triangulation to determine the location of the distinctive point with respect to the cameras 66a, 66b and thus with respect to the measuring system 50 from the known distance between the two cameras 66a, 66b and the different location of the distinctive point in the two images. A distinctive point can also be referred to as a wall point of a shaft wall.

An inertial measuring unit 70 is arranged between the two cameras 66a, 66b. The inertial measuring unit 70 has three acceleration sensors (not shown), each arranged perpendicularly with respect to one another, and three rotation rate sensors (also not shown), arranged perpendicularly with respect to one another, by means of which the accelerations in the x, y and z directions and the rotational accelerations around the x, y and z axes can be determined. From the measured accelerations, the inertial measuring unit 70 can estimate its position and thus also the position of the measuring system 50 based on a starting position and transmit these positions to the evaluation unit 68 of the measuring system 50.

To more precisely determine the position of the measuring system 50 in the vertical direction in the elevator shaft 10, the measuring system 50 is coupled to a position determining unit 72. The position determination unit 72 has a vertically aligned code strip 74 which is tensioned between the shaft bottom 64 and the shaft ceiling 58. The code strip 74 has invisible magnetic code marks which represent information regarding the position in the vertical direction. The position determination unit 72 also has a reading unit 76 which is arranged on the measuring system 50 and through which the code strip 74 is passed. The reading unit 76 reads out information in the form of the magnetic code marks of the code strip 74 and can thus very precisely determine the position of the reading unit 76 and thus of the measuring system 50 in the vertical direction.

The position of the measuring system 50 in the vertical direction determined by the position determination unit 72 is regarded as the correct position of the measuring system 50 and thus replaces the position of the measuring unit 50 in the vertical direction estimated by the inertial measuring unit 70.

From the position of the measuring system 50, determined as described above, and the location of a distinctive point with respect to the measuring system 50, determined by means of triangulation, the evaluation unit 68 determines the absolute position of the distinctive point, i.e., a wall point. The evaluation unit 68 thus determines the positions of a large number of wall points and thus creates a digital model of the elevator shaft 10, which initially consists of a large number of individual points, i.e., a so-called point cloud. In order to measure the entire elevator shaft 10, the measuring system 50 is displaced by the winch 56 from top to bottom in the elevator shaft 10.

Instead of or in addition to using the position determination unit 72, further information and aids for measuring the elevator shaft 10 can be used. Such aids are also shown in FIG. 1. In the region of the shaft openings 52a, 52b, 52c, a reference element in the form of a marking 78a, 78b, 78c is arranged on each shaft wall. The markings 78a, 78b, 78c are designed as so-called meter lines, which mark a distance of one meter from the subsequent floor covering. The absolute height above normal zero or the relative height above the shaft bottom 64 is known for the markings 78a, 78b, 78c. The positions of the markings 78a, 78b, 78c in the vertical direction within the elevator shaft 10 are thus known. The evaluation unit 68 can determine the location of a marking 78a, 78b, 78c with respect to the measuring system 50 as described above and deduce the actual position of the measuring system 50 in the vertical direction on the basis of the known position of the marking 78a, 78b, 78c in the vertical direction and the aforementioned location. This actual position of the measuring system 50 determined in this way is then used for the measurement of the elevator shaft 10.

Supplementary or in addition to the markings 78a, 78b, 78c, a reference element, in particular two elongate reference elements in the form of two cables 13, can be tensioned between the shaft bottom 64 and the shaft ceiling 58. The cables 13 have, in particular, a diameter of approx. 8-12 mm. The cables 13 thus extend next to one another in the vertical direction. A marking in the form of a sphere 80 is arranged in each case in the region of the shaft bottom 64 and the shaft ceiling 58. By means of the cables 13 and the spheres 80, the evaluation unit 68 can define a coordinate system that can also be used for a later installation of the elevator system. Instead of the aforementioned spheres, the cables can also have a pattern that can be recognized and evaluated by the evaluation unit.

After the elevator shaft 10 has been measured, i.e., after the described point cloud has been recorded, the recorded data are post-processed. This post-processing is not carried out by the evaluation unit 68, but by a more powerful computer (not shown). Various effective programs are available on the market for such post-processing. The data of the point cloud can be transmitted from the evaluation unit 68 to the aforementioned computer, for example, via a wireless data connection or a data memory, for example a USB memory stick.

Figure 2:
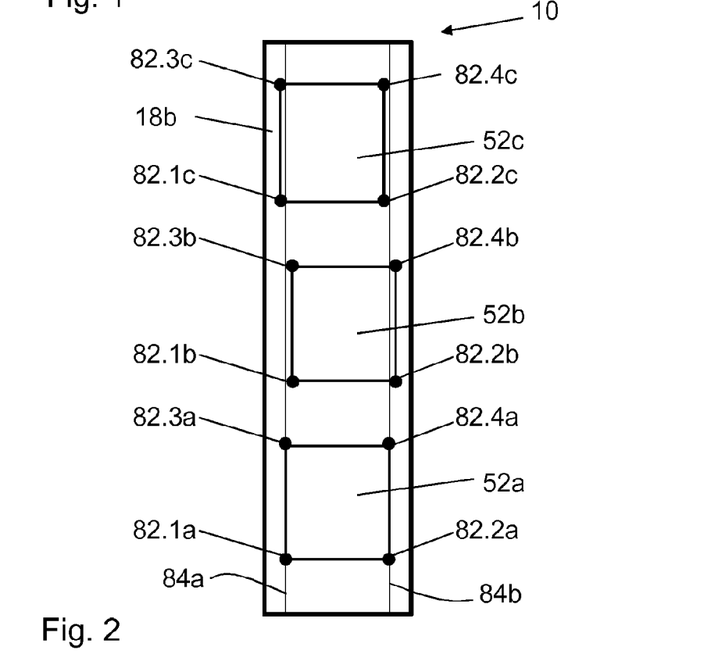
FIG. 2 shows door cut-outs of the elevator shaft from FIG. 1.

The second method step of the at least partially automated planning of the installation of elevator components is also carried out on the aforementioned computer. For this purpose, the positions of the door openings 52a, 52b, 52c are determined in an automated manner. These are shown in FIG. 2 in a view from the front. The positions of the door openings 52a, 52b, 52c are determined by the positions of the four corners 82.1a, 82.2a, 82.3a, 82.4a, 82.1b, 82.2b, 82.3b, 82.4b, 82.1c, 82.2c, 82.3c, 82.4c of the substantially rectangular door openings 52a, 52b, 52c. For this purpose, the course of the front shaft wall 18b is evaluated by a computer program. In a first step, rough positions of the four corners 82.1a, 82.2a, 82.3a, 82.4a, 82.1b, 82.2b, 82.3b, 82.4b, 82.1c, 82.2c, 82.3c, 82.4c are determined on the basis of 2D data of the course of the front shaft wall 18b. The exact positions of the four corners 82.1a, 82.2a, 82.3a, 82.4a, 82.1b, 82.2b, 82.3b, 82.4b, 82.1c, 82.2c, 82.3c, 82.4c in the vicinity of the aforementioned rough positions are then determined on the basis of 3D data. The determined positions of the corners 82.1a, 82.2a, 82.3a, 82.4a, 82.1b, 82.2b, 82.3b, 82.4b, 82.1c, 82.2c, 82.3c, 82.4c are displayed on a screen (not shown) of the computer. If necessary, i.e., if the automatic determination of the positions has not provided a satisfactory result, an operator can change the positions.

Instead of automatically determining the positions of the door openings 52a, 52b, 52c, this can also be carried out manually by an operator on the basis of the post-processed point cloud.

The third method step of the at least partially automated planning of the installation of elevator components is also carried out on the aforementioned computer. To establish the position of the guide rails, a straight line is automatically drawn through corners of the door openings 52a, 52b, 52c on both sides of the door openings 52a, 52b, 52c. There is thus a first, left-hand straight line 84a through the corners 82.1a, 82.3a, 82.1b, 82.3b, 82.1c, 82.3c and a second, right-hand straight line 84b through the corners 82.2a, 82.4a, 82.2b, 82.4b, 82.2c, 82.4c. For this purpose, the least squares method is used. The two straight lines are established in such a way that the sum of the squares of the distances between the aforementioned corners and the particular straight line is minimal. The two straight lines 84a, 84b are also determined in such a way that they are parallel to one another and extend in the vertical direction. Depending on the dimensions of the elevator car of the elevator system, target courses of two guide rails 86a, 86b for guiding the elevator car are obtained.

Figure 3:
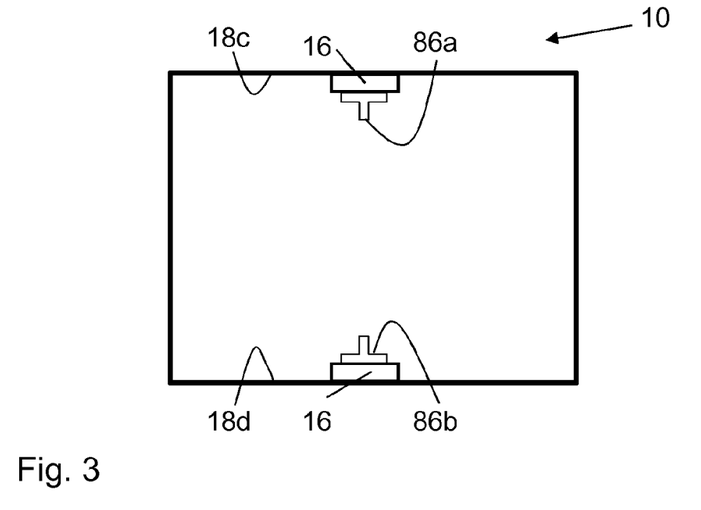
FIG. 3 is a view from above into an elevator shaft comprising two guide rails.
Figure 4:
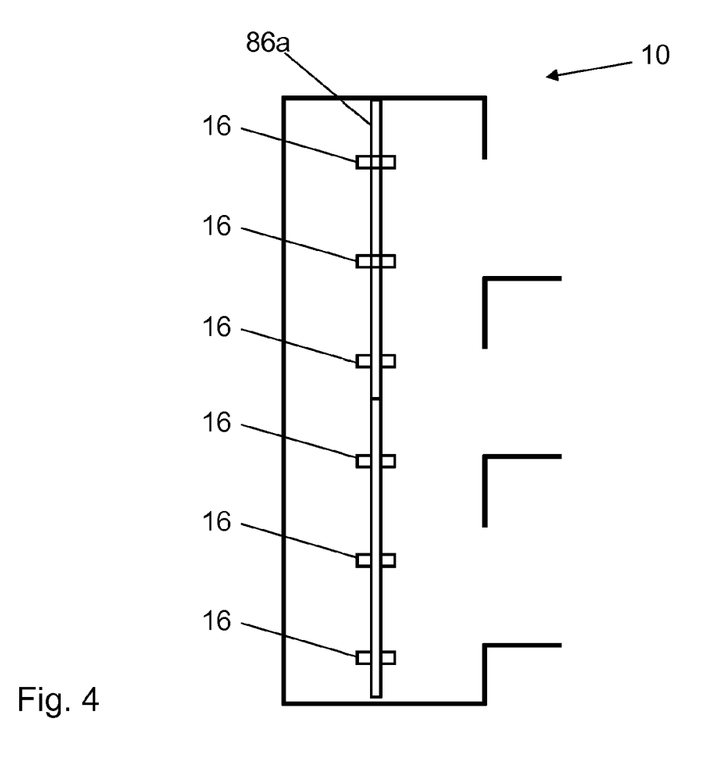
FIG. 4 shows a guide rail fixed to a shaft wall by means of rail brackets.

According to FIGS. 3 and 4, the guide rails 86a, 86b are fixed to the side shaft walls 18c, 18d by means of adjustable elevator components in the form of rail brackets 16. In order for the guide rails 86a, 86b to be able to extend according to their target course, target positions of the rail brackets 16 are automatically determined in a fourth method step of the at least partially automated planning of the installation of elevator components. In addition to the position in the horizontal direction (x, y direction), a position in the vertical direction (z direction) is also determined. The position in the vertical direction is determined in such a way that two rail brackets 16 arranged one above the other have a defined distance from one another.

Figure 5:
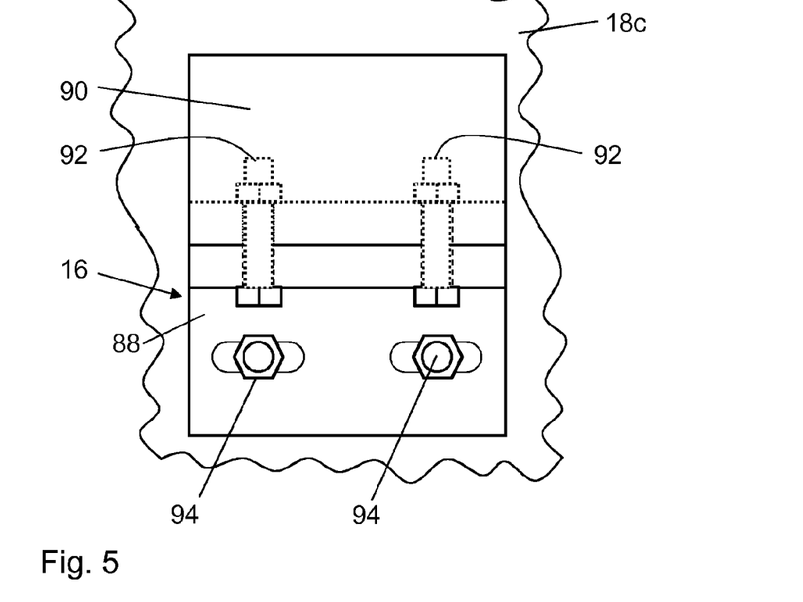
FIG. 5 shows a rail bracket on a shaft wall in a view from the front.
Figure 6:
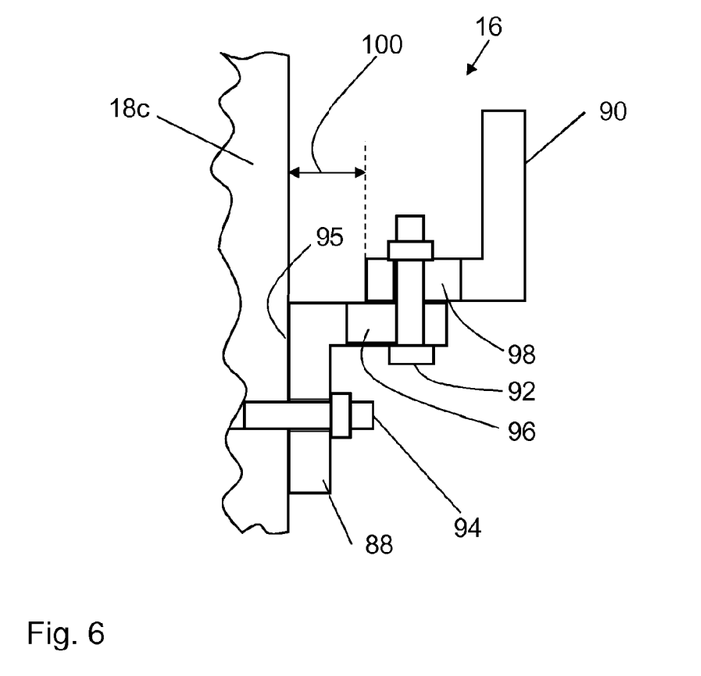
FIG. 6 is a sectional view of the rail bracket from FIG. 5.

According to FIGS. 5 and 6, a rail bracket 16 consists of a rail bracket lower part 88 and a rail bracket upper part 90, which are screwed together by means of two screw-nut connections 92. When mounted, the rail bracket lower part 88 is fixed to the shaft wall 18c by means of a bolt-screw connection 94. A contact surface 95 of the rail bracket lower part 88 abuts the shaft wall 18c. The rail bracket lower part 88 is thus a fixable part of the elevator component designed as a rail bracket. When the elevator system has been mounted, the guide rail 86a (not shown in FIGS. 5 and 6) is fixed to the rail bracket upper part 90. The position of the rail bracket upper part 90 thus establishes the course of the guide rail 86a. A target position of the guide rail upper part 90 is thus also obtained from the target course of the guide rail 86a.

The rail bracket lower part 88 has a first elongate hole 96 and the rail bracket upper part 90 has a corresponding second elongate hole 98. The screw-nut connection 92 extends through the two elongate holes 96, 98. As long as the screw-nut connection 92 is not firmly tightened, this arrangement allows the rail bracket upper part 90 to be displaced relative to the rail bracket lower part 88; the rail bracket upper part 90 can thus be adjusted relative to the rail bracket lower part 88. The rail bracket upper part 90 is thus a movable part of the elevator component designed as a rail bracket. The rail bracket upper part 90 in FIG. 6 has a maximum distance from the shaft wall 18c. In the other extreme case (not shown), the rail bracket upper part 90 abuts the shaft wall 18c. This results in the adjustment range of the rail bracket 16 symbolized by the arrow 100.

In the fourth method step of the at least partially automated planning of the installation of elevator components, a program executed on the aforementioned computer automatically checks whether, when the rail bracket upper part 90 is positioned at its target position, the adjustment range 100 of the rail bracket 16 is sufficient to fix the rail bracket lower part 88 to the shaft wall 18c. This test is carried out for all rail brackets 16 to be installed and the results of the test are output for further processing, in particular on another program running on the aforementioned computer, or on the screen.

In addition, an automated check is carried out to determine whether the adjustment ranges of the shaft doors are sufficient to mount them in the door openings 52a, 52b, 52c in a position resulting from the target course of the guide rails 86a, 86b.

As described, the contact surface 95 of the rail bracket lower part 88 abuts the shaft wall 18c and is thus supported on the shaft wall 18c. To put it more precisely, the contact surface 95 abuts a support surface of the shaft wall 18c. A target support surface 102 on the shaft wall (shown in FIG. 7) results from the target position of the rail bracket upper part 90 and the possible coupling to the rail bracket lower part 88. According to a further method step of the at least partially automated planning of the installation of elevator components, a surface contour of the target support surface 102 is automatically checked. A check is carried out to determine whether the surface contour has irregularities which can prevent the rail bracket lower part 88 from being fixed to the shaft wall 18c.

Figure 7:
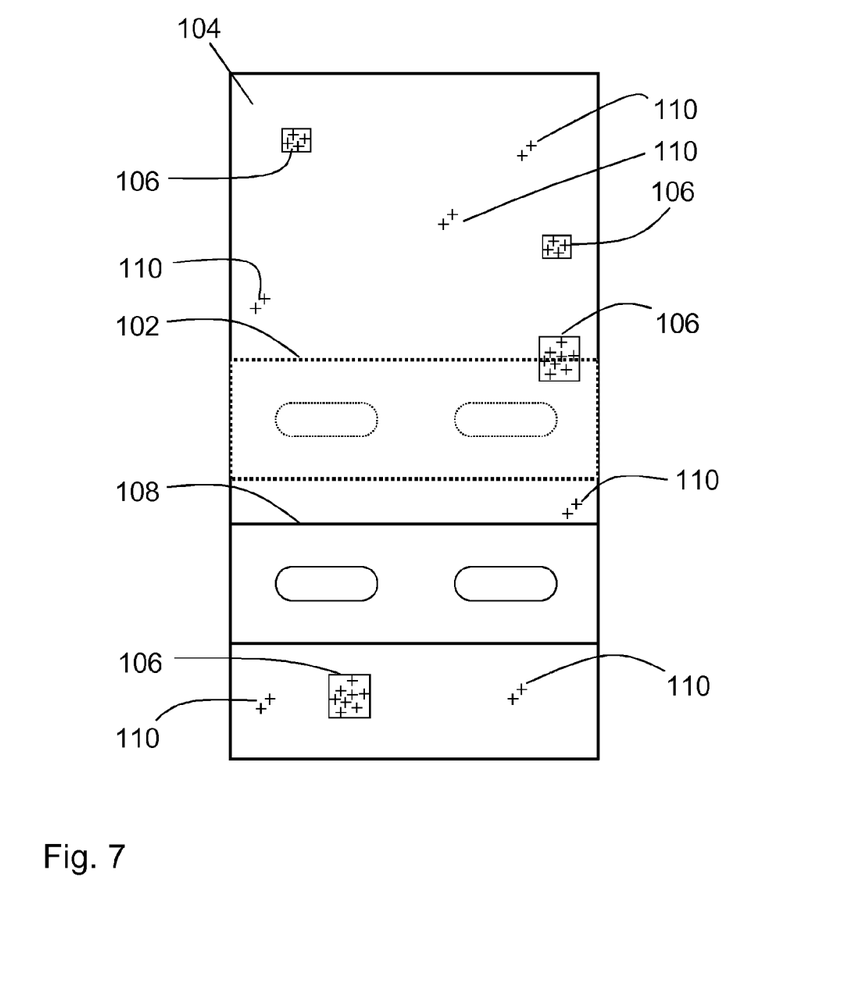
FIG. 7 is a section of a shaft wall having irregularities in the surface contour.

First, when determining the surface contour of the target support surface 102, an ideal wall surface is determined using the determined positions of the aforementioned wall points. The ideal wall surface is not only determined for the target support surface 102, but also for a so-called displacement region 104, within which the target support surface can be displaced upward and downward. The ideal wall surface is determined using the RANSAC algorithm. After determining the ideal wall surface, the distances between the individual wall points and the ideal wall surface are determined. These distances serve as the basis for the recognition of irregularities in the surface contour of the target support surface 102.

After the surface contour of the target support surface 102 has been determined, a check is carried out and first irregularities in the surface contour are recognized by means of a first recognition rule. The first recognition rule consists of the following steps:

determining wall points which are at a distance from the ideal wall surface that is greater than a first threshold value;

combining neighboring wall points which meet the aforementioned condition; and recognizing a first irregularity when an area of the combined wall points is greater than a boundary area.

The first threshold value is, for example, between 5 and 10 mm and the boundary surface area is, for example, between 15 and 30 cm$^2$. When the wall points are combined as mentioned above, the wall points are combined which meet the aforementioned condition and also have a distance from another wall point which meets the aforementioned condition and which is less than a limit distance of, for example, 5 to 50 mm. In addition, when combining, a rectangle is defined that contains all of the aforementioned wall points. This results in a total of four first irregularities 106 in the example shown in FIG. 7.

After the first irregularities have been determined, an automated check is carried out to determine whether there is a first irregularity 106 in the target support surface 102. This is the case so that the target position of the rail bracket upper part is automatically displaced downward in the vertical direction. This leads to the target support surface 102 also being displaced downwards in the vertical direction onto a new target support surface 108. It is assumed that the adjustment range 100 of the rail bracket 16 is sufficient to fix the rail bracket lower part 88 to the shaft wall 18c. The new target support surface 108 is then also checked for first irregularities 106. If there is no first irregularity 106 in the new target support surface 108, a further test is carried out. For this purpose, second irregularities are recognized by means of a second recognition rule.

The second recognition rule for recognizing second irregularities in the surface contour comprises the following steps:

determining wall points which are at a distance from the ideal wall surface that is greater than a second threshold value; and recognizing a second irregularity at each wall point which meets the aforementioned condition.

The second threshold value is between 3 and 5 mm, for example. This results in a series of second irregularities 110 in the example shown in FIG. 7.

After the second irregularities have been determined, an automated check is carried out to determine whether there is a second irregularity 110 in the new target support surface 108. This is not the case here if the new target support surface 108 is accepted as the support surface 108. The check of the surface contour of the new target support surface 108 for the rail bracket lower part 88 thus provides a positive result.

If there were a first irregularity 106 or a second irregularity 110 in the new target support surface 108, the target position of the rail bracket upper part 90 and thus the target support surface would have been shifted again and the new target support surface would have been checked again. This process is repeated until a support surface is found or the upper and lower ends of the displacement region 104 have been reached.

The described check of the surface contour is carried out for all elevator components to be installed, i.e., for adjustable and non-adjustable elevator components. If all tests deliver a positive result, the installation can thus be carried out. The result is displayed to an operator on a screen of the computer.

If the adjustment range is insufficient for one or more elevator components or if no suitable support surface can be found, the target courses of the guide rails can be automatically changed and the entire tests can be carried out again. The target courses can be shifted, for example, by an established distance, for example 1-3 cm parallel to the door openings.

If the adjustment range is not sufficient for one or more elevator components, a necessary adjustment range for this elevator component can also be determined and output automatically. The operator can establish which variant is executed by making appropriate entries on the computer.

At least some shaft components are to be executed by an automated mounting device comprising an installation component. In order for this to be carried out successfully, a final check is carried out to determine whether the mounting device can install the elevator components at their respective target positions on the shaft walls.

For this purpose, a simulation of the mounting of the individual elevator components is carried out. During the simulation, a check can be carried out, by an operator or in an automated manner, to determine whether the mounting steps can actually be carried out or whether there are, for example, collisions between the installation component and the elevator shaft or the carrier component.

Figure 8:
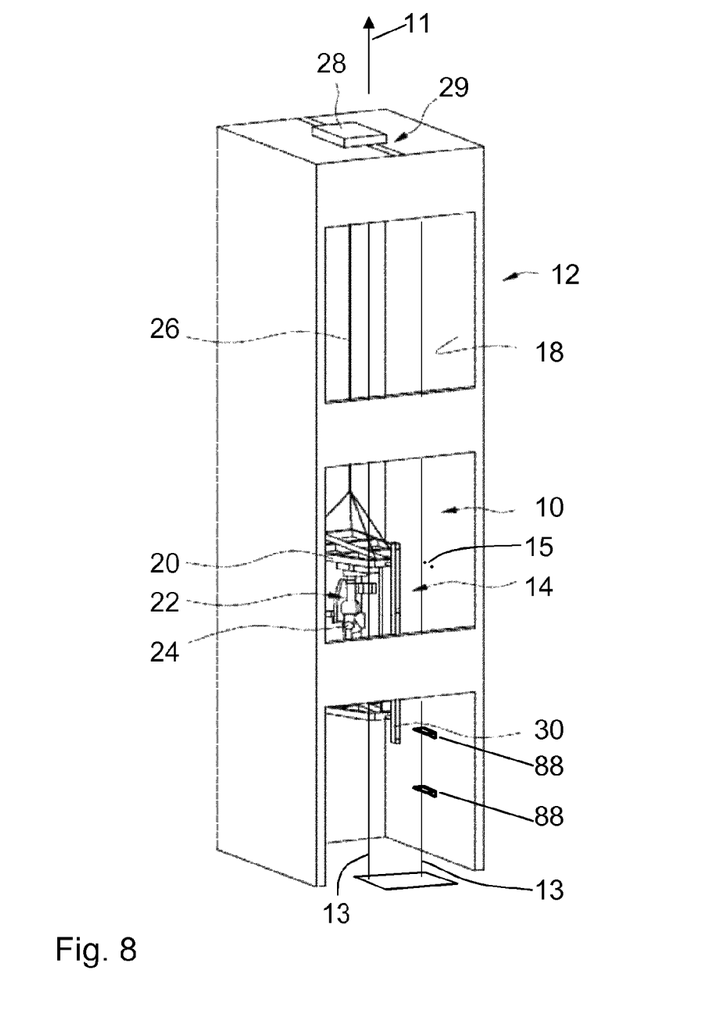
FIG. 8 is a perspective view of an elevator shaft of an elevator system comprising a mounting device received therein.

FIG. 8 shows an automated mounting device 14 arranged in an elevator shaft 10 of an elevator system 12, by means of which mounting device rail bracket lower parts 88 can be fixed to a shaft wall 18c. For this purpose, holes 15 can be drilled into the shaft wall 18 by the mounting device 14. The elevator shaft 10 extends in a main extension direction 11 which is oriented vertically in FIG. 8. In a later mounting step, guide rails (not depicted) of the elevator system 12 can be fixed to the shaft wall 18 via the rail bracket lower parts 88. The mounting device 14 has a carrier component 20 and a mechatronic installation component 22. The carrier component 20 is designed as a frame on which the mechatronic installation component 22 is mounted. Said frame has dimensions that make it possible to vertically displace the carrier component 20 within the elevator shaft 10, i.e., for example, to move it to different vertical positions on different floors within a building. In the depicted example, the mechatronic installation component 22 is designed as an industrial robot 24 which is attached to the frame of the carrier component 20 so as to be suspended downwardly. In this case, one arm of the industrial robot 24 can be moved relative to the carrier component 20 and displaced, for example, toward the shaft wall 18 of the elevator shaft 10.

Via a steel cable used as a suspension means 26, the carrier component 20 is connected to a displacement component 28 in the form of a motor-driven cable winch that is attached at the top of the elevator shaft 10 to a retaining point 29 on the ceiling of the elevator shaft 10. By means of the displacement component 28, the mounting device 14 can be displaced within the elevator shaft 10 in the main extension direction 11 of the elevator shaft 10, i.e., vertically over the entire length of the elevator shaft 10.

The mounting device 14 further comprises a fixing component 30 and support rollers 31 (see FIG. 9), by means of which the carrier component 20 can be fixed within the elevator shaft 10 in the lateral direction, i.e., in the horizontal direction.

Two reference elements 13 in the form of cords are tensioned in the elevator shaft 10 over the entire length thereof, which elements are oriented along the main extension direction 11. These cords 13 are in particular the same ones that were already tensioned in the elevator shaft 10 when the elevator shaft 10 was measured.

Figure 9:
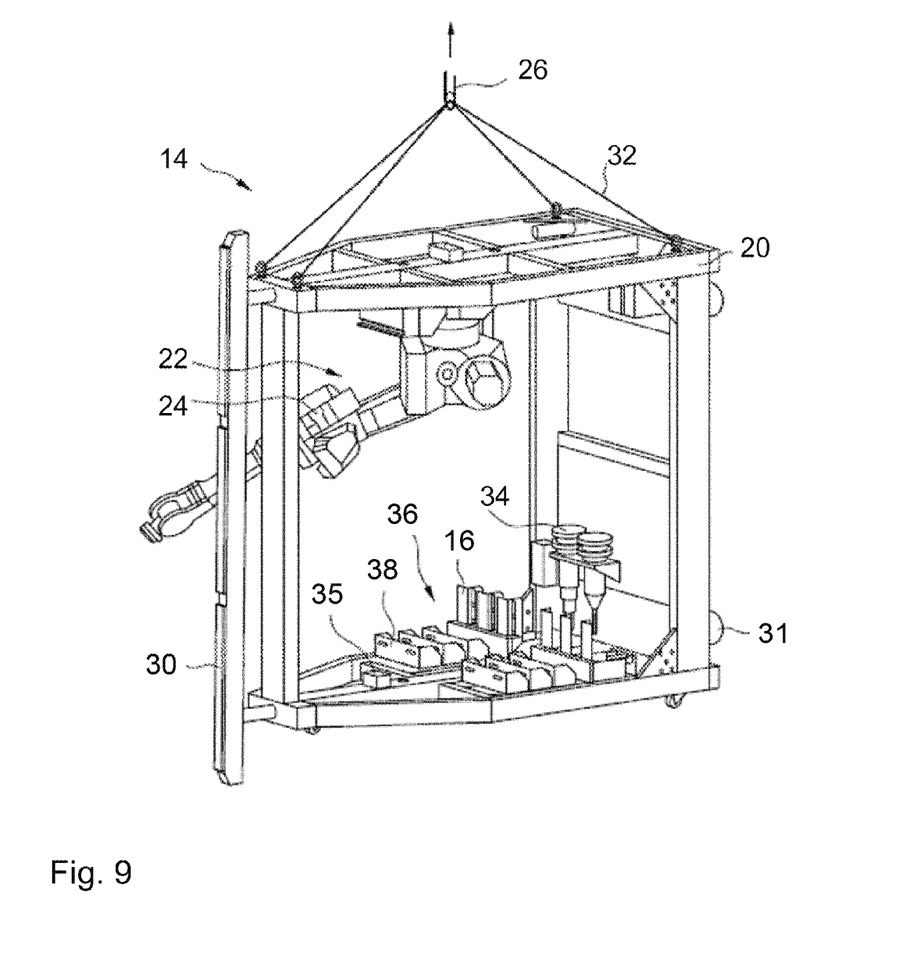
FIG. 9 is a perspective view of the mounting device from FIG. 8.

FIG. 9 is an enlarged view of a mounting device 14.

The carrier component 20 is designed as a cage-like frame in which a plurality of horizontally and vertically extending bars form a mechanically resistant structure. Retaining cables 32 are attached to the top of the cage-like carrier component 20, which cables can be connected to the suspension means 26.

In the depicted embodiment, the mechatronic installation component 22 is formed using an industrial robot 24. In the example shown, the industrial robot 24 is equipped with a plurality of robotic arms that are pivotable about pivot axes. The industrial robot may, for example, have at least six degrees of freedom, i.e., a mounting tool 34 guided by the industrial robot 24 can be moved with six degrees of freedom, i.e., for example, with three degrees of rotational freedom and three degrees of translational freedom. The industrial robot can, for example, be designed as a vertical buckling arm robot, a horizontal buckling arm robot, a SCARA robot or a Cartesian robot, or as a portal robot.

The unsupported end of the robot can be coupled to different mounting tools 34. The mounting tools 34 can differ with regard to their design and their intended use. The mounting tools 34 can be held on the carrier component 20 in a magazine 36 in such a way that the unsupported end of the industrial robot 24 can be brought toward said tools or sensors 35 and be coupled to one thereof. For this purpose, the industrial robot 24 can have, for example, a tool changing system which is designed such that it allows at least the handling of a plurality of mounting tools 34 of this kind. The magazine 36 also can be used to store the rail brackets 16 and has bins 38 for storing components such as the bolt-screw connections 94.

Finally, it must be noted that terms such as "having," "comprising," etc. do not preclude other elements or steps and terms such as "a" or "an" do not preclude a plurality. It must further be noted that features or steps that have been described with reference to one of the above embodiments can also be used in combination with other features or steps of other embodiments described above.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A method for at least partially automated planning of an installation of elevator components in an elevator shaft delimited by shaft walls, the method comprising the following steps:
   recording a course of each shaft wall delimiting an elevator shaft;
   determining positions of door openings in the elevator shaft;
   establishing a target course of a guide rail depending on the positions of the door openings, including defining a line through corners of the door openings and establishing the target course of the guide rail based on the line and dimensions of an elevator car, where the guide rail is adapted to guide an elevator car in the elevator shaft;
   establishing target positions of elevator components to be installed in the elevator in an automated manner depending on the established target course of the guide rail;
   wherein at least some of the elevator components to be installed are adjustable elevator components having a fixable part adapted to be fixed to one of the shaft walls and a movable part movable in an established adjustment range with respect to the fixable part, and the target positions are established for the movable parts;
   for each of the adjustable elevator components, performing an automated check to determine whether, when the movable part of the adjustable elevator component is positioned at the established target position, the established adjustment range is sufficient to fix the fixable part to the shaft wall; and
   outputting results of the automated checks for further processing.

2. The method according to claim 1 wherein the adjustable elevator components are rail brackets for fastening the guide rail to the shaft wall and the rail brackets each have a rail bracket lower part as the fixed part and a rail bracket upper part as the movable part.

3. The method according to claim 1 wherein the elevator components are adapted to be supported on support surfaces on the shaft wall and including deriving a surface contour of a target support surface from the recorded courses of the shaft walls and the target position of one of the elevator components, automatically checking the surface contour of the target support surface, and outputting results of the check of the target support surfaces for further processing.

4. The method according to claim 3 including recognizing first irregularities in the surface contour of the target support surface by a first recognition rule and outputting a result as to whether the target support surface is free from any of the recognized first irregularities.

5. The method according to claim 4 recognizing, when the target support surface does not have any of the first irregularities, second irregularities in the surface contour of the target support surface by a second recognition rule and outputting a result as to whether the target support surface is free from any of the second irregularities.

6. The method according to claim 1 including, when the result of the automated check for one of the adjustable elevator components is negative, automatically shifting the established target position to a new target position and performing the automated check for the new target position.

7. The method according to claim 6 wherein the automated shifting of the established target position is performed within a predetermined displacement range and a negative result is output if no suitable target position can be found within the displacement range.

8. The method according to claim 1 wherein, when the result of the automated check is negative, automatically changing the established target course of the guide rail.

9. The method according to claim 1 wherein, when the result of the automated check is negative, automatically determining and outputting a necessary adjustment range for the adjustable elevator component.

10. The method according to claim 1 including automatically determining the positions of the door openings from the recorded courses of the shaft walls.

11. The method according to claim 10 wherein the positions of the door openings are automatically determined by initially determining rough positions of the door openings and then determining the positions of the door openings in a region around the rough positions.

12. The method according to claim 10 including an operator to change the automatically determined positions of the door openings.

13. The method according to claim 1 including performing the method steps by an automated mounting device and checking during the planning whether the mounting device can install the elevator components at the established target positions on the shaft walls.

14. A method for at least partially automated planning of an installation of elevator components in an elevator shaft delimited by shaft walls, the method comprising the following steps:

recording a course of each shaft wall delimiting an elevator shaft;

determining positions of door openings in the elevator shaft;

establishing a target course of a guide rail depending on the positions of the door openings;

establishing target positions of elevator components to be installed in the elevator in an automated manner depending on the established target course of the guide rail;

wherein at least some of the elevator components to be installed are adjustable elevator components having a fixable part adapted to be fixed to one of the shaft walls and a movable part movable in an established adjustment range with respect to the fixable part, and the target positions are established for the movable parts;

for each of the adjustable elevator component, performing an automated check to determine whether, when the movable part of the adjustable elevator component is positioned at the established target position, the established adjustment range is sufficient to fix the fixable part to the shaft wall;

outputting results of the automated checks for further processing; and wherein the elevator components are adapted to be supported on support surfaces on the shaft wall and including deriving a surface contour of a target support surface from the recorded courses of the shaft walls and the target position of one of the elevator components, automatically checking the surface contour of the target support surface, and outputting results of the check of the target support surfaces for further processing.

15. The method according to claim 14 including recognizing first irregularities in the surface contour of the target support surface by a first recognition rule and outputting a result as to whether the target support surface is free from any of the recognized first irregularities.

16. The method according to claim 15 recognizing, when the target support surface does not have any of the first irregularities, second irregularities in the surface contour of the target support surface by a second recognition rule and outputting a result as to whether the target support surface is free from any of the second irregularities.

* * * * *